United States Patent [19]

Kihara et al.

[11] Patent Number: 5,756,254

[45] Date of Patent: May 26, 1998

[54] RESIST, METHOD OF FORMING A RESIST PATTERN AND MANUFACTURING AN ELECTRONIC PARTS USING THE RESIST

[75] Inventors: Naoko Kihara, Matsudo; Satoshi Saito; Hiromitsu Wakabayashi, both of Yokohama; Makoto Nakase, Tokyo; Masayuki Oba, Yokohama, all of Japan

[73] Assignee: Kabushiki Kaisha Toshiba, Kawasaki, Japan

[21] Appl. No.: 654,215

[22] Filed: May 28, 1996

[30] Foreign Application Priority Data

Jun. 1, 1995 [JP] Japan ................................... 7-134615
Mar. 12, 1996 [JP] Japan ................................... 8-055027

[51] Int. Cl.⁶ .................................................. G03F 7/004
[52] U.S. Cl. .......................... 430/270.1; 430/905; 430/910
[58] Field of Search ........................... 430/270.1, 170, 430/910, 905

[56] References Cited

U.S. PATENT DOCUMENTS

| | | | |
|---|---|---|---|
| 4,299,910 | 11/1981 | Hung et al. | 430/270.1 |
| 4,869,995 | 9/1989 | Shirai et al. | 430/270.1 |
| 4,889,791 | 12/1989 | Tsuchiya et al. | 430/270.1 |
| 4,965,340 | 10/1990 | Matsuda et al. | 430/270.1 |
| 5,002,853 | 3/1991 | Aoai et al. | 430/270.1 |
| 5,066,566 | 11/1991 | Novembre | 430/296 |
| 5,348,838 | 9/1994 | Ushirogouchi et al. | 430/270.1 |
| 5,372,914 | 12/1994 | Naito et al. | 430/270.1 |
| 5,420,331 | 5/1995 | Ueda et al. | 430/270.1 |
| 5,563,022 | 10/1996 | Binder et al. | 430/270.1 |

FOREIGN PATENT DOCUMENTS 59-52822  12/1984  Japan.
63-27829  2/1988  Japan.
3-223866  10/1991  Japan.

*Primary Examiner*—John S. Chu
*Attorney, Agent, or Firm*—Oblon, Spivak, McClelland, Maier & Neustadt, P.C.

[57] ABSTRACT

A resist comprising a sulfonyl compound represented by the following general formula (1):

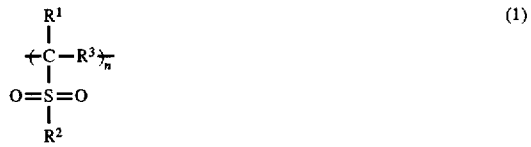

wherein $R^1$ is a hydrogen atom, a halogen atom, nitro group, cyano group or a monovalent organic group, $R^2$ is a halogen atom, nitro group, cyano group or a monovalent organic group, $R^3$ is a bivalent organic group, and n is an integer of 2 or more. The $R^3$ in the general formula (1) is preferably a bivalent organic group represented by the general formula (2):

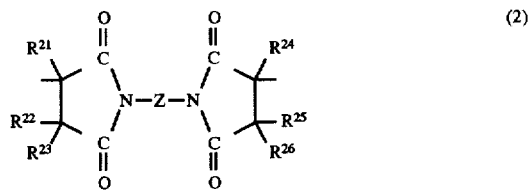

wherein $R^{21}$, $R^{22}$, $R^{23}$, $R^{24}$, $R^{25}$ and $R^{26}$ may be the same or different and are individually a hydrogen atom, a halogen atom, nitro group, cyano group or a monovalent organic group, and Z is a bivalent organic group.

22 Claims, 1 Drawing Sheet

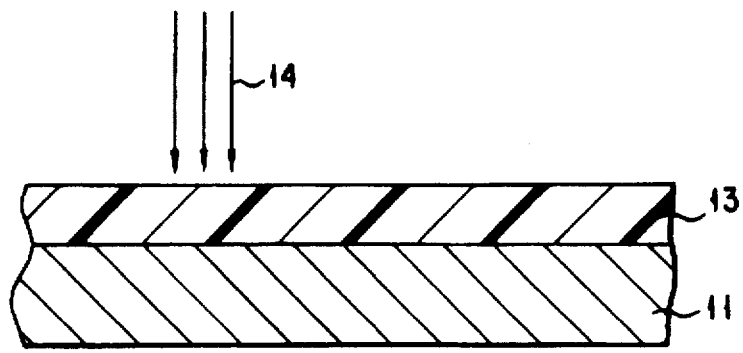
F I G. 1A
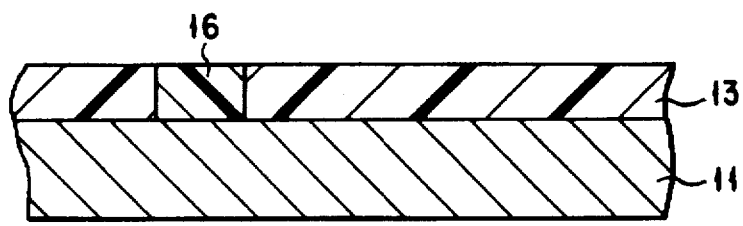
F I G. 1B
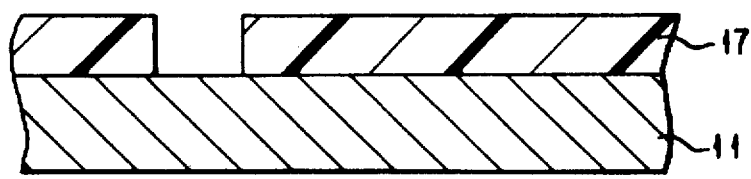
F I G. 1C
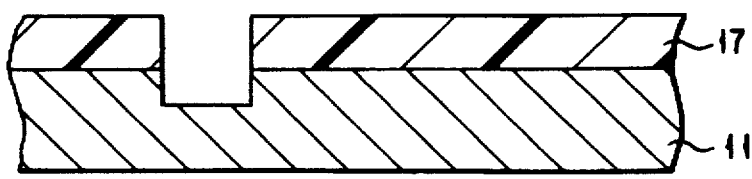
F I G. 1D
F I G. 1E

RESIST, METHOD OF FORMING A RESIST PATTERN AND MANUFACTURING AN ELECTRONIC PARTS USING THE RESIST

BACKGROUND OF THE INVENTION

1. Field of the Invention

This invention relates to a resist suited for use in a fine working of electronic parts and in the formation of an insulating film pattern.

2. Description of the Related Art

A resist is extensively utilized in a fine working required in the manufacture of electronic parts of various kinds including a semiconductor integrated circuit such as LSI. In particular, in view of coping with a recent trend of increased integration of electronic parts, the formation of very fine resist pattern is required for the manufacture of electronic parts.

Therefore, the employment of a shorter wavelength as a light source for the formation of a resist pattern has now been studied. Namely, the employment of a KrF excimer laser 248nm in wavelength as a light source or an irradiation of an ionizing radiation such as electron beam or X-ray has been developed for the formation of a very fine pattern of resist. At the same time, a many number of resists having a sufficiently high sensitivity to such a light source have been proposed.

For example, Japanese Patent Unexamined Disclosure S63-27829 discloses a chemical amplification type resist comprising an alkali-soluble compound, a solubility inhibitor and a photo-acid generator. In the chemical amplification type resist of this kind, the solubility of non-exposure portions of the resist to an alkaline solution is inhibited by the solubility inhibitor, and on the other hand an acid is caused to generate from the photo-acid generator at the exposure portions so as to decompose the solubility inhibitor during the baking treatment after the light exposure. Furthermore, even if the amount of the acid generated from the photo-acid generator is very little in this chemical amplification type resist, the acid is capable of decomposing a large amount of solubility inhibitor, so that this chemical amplification type resist is highly sensitive to light and capable of forming a very fine pattern.

However, since this chemical amplification type resist generally contains, as a photo-acid generator, a low molecular weight compound such as an onium salt, if this low molecular weight compound is incorporated in a large amount into the resist in an attempt to improve the sensitivity of the resist, the rigidity of the resist film to be formed becomes rather poor so that the resultant resist pattern may be easily collapsed or fractured. Therefore, it is difficult with this chemical amplification type resist to obtain a very fine pattern which is also high in aspect ratio.

On the other hand, the surface of semiconductor device is generally covered by a protective film for the purpose of protecting it from the outer environment and enhancing the reliability of the device. In this case, polyimide resin which is excellent in electric properties such as insulation and in heat resistance is generally employed as the aforementioned protective film. This polyimide resin is also extensively employed as an interlayer insulating film in a multilayer interconnection structure of semiconductor device.

Additionally, there has been proposed to use as a photoresist a photosensitive polyimide or polyamide acid which is a precursor of the polyimide in view of simplifying the working process of the polyimide film. For example, Japanese Patent Publication S59-52822 discloses a photosensitive material comprising polyamide acid, a compound having acryloyl group as a photosensitive component, maleimide compound as a copolymerizable monomer, and a sensitizer. However, in the formation of a pattern using a photo-sensitive polyimide, an organic solvent is used as a developing solution, thus giving rise to the problem that a pattern to be obtained will be swollen at the occasion of development, thus making it very difficult to enhance the resolution.

SUMMARY OF THE INVENTION

As explained above, since the conventional chemical amplification type resist generally contains, as a photo-acid generator, a low molecular weight compound such as an onium salt, it is very difficult to obtain a resist film having a sufficient rigidity, thus giving rise to the problem that the resultant resist pattern may be easily collapsed or fractured. On the other hand, Japanese Patent Unexamined Publication H4-251850 sets forth a technique of using as a resist a polymer having an acid-generating site in the backbone chain thereof which generates an acid upon being irradiated with light. However, there is a serious limitation in the design of the polymer to be used as a resist, and at the same time even though it contains no low molecular compound as a photo-acid generating agent, the site of the backbone chain which generates an acid by light exposure is structurally fragile so that it is difficult to obtain a sufficient rigidity when the polymer is formed into a resist film.

Therefore, the object of the present invention is to solve the aforementioned problems and to provide a resist which is capable of forming a resist film having a sufficient rigidity and of forming a resist pattern free from the collapse and fracture of the pattern so that a very fine resist pattern having a high aspect ratio can be obtained with a high sensitivity.

Further object of the present invention is to provide a method of forming a resist pattern which is free from the collapse and fracture of the pattern so that a very fine resist pattern having a high aspect ratio can be obtained.

Still further object of this invention is to provide a method of manufacturing electronic parts comprising a fine working step using the resist.

According to the present invention, there is provided a resist comprising a sulfonyl compound represented by the following general formula (1):

wherein $R^1$ is a hydrogen atom, a halogen atom, nitro group, cyano group or a monovalent organic group, $R^2$ is a halogen atom, nitro group, cyano group or a monovalent organic group, $R^3$ is a bivalent organic group, and n is an integer of 2 or more.

According to the present invention, there is provided a method of forming a resist pattern, which comprises the steps of:

coating a resist comprising a sulfonyl compound represented by the following general formula (1) on a substrate thereby forming a resist film;

exposing the resist film to a light pattern; and developing the resist film by using a developing solution:

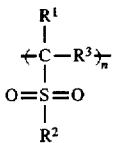
(1)

wherein $R^1$ is a hydrogen atom, a halogen atom, nitro group, cyano group or a monovalent organic group, $R^2$ is a halogen atom, nitro group, cyano group or a monovalent organic group, $R^3$ is a bivalent organic group, and n is an integer of 2 or more.

According to the present invention, there is provided a method of manufacturing electronic parts, which comprises the steps of:

coating a resist comprising a sulfonyl compound represented by the following general formula (1) on a substrate thereby forming a resist film;

exposing the resist film to a light pattern;

developing the resist film by using a developing solution thereby forming a resist pattern; and performing a patterning of the substrate by making use of the resist pattern as an etching mask.

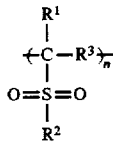
(1)

wherein $R^1$ is a hydrogen atom, a halogen atom, nitro group, cyano group or a monovalent organic group, $R^2$ is a halogen atom, nitro group, cyano group or a monovalent organic group, $R^3$ is a bivalent organic group, and n is an integer of 2 or more.

BRIEF DESCRIPTION OF THE DRAWING

FIGS. 1A to 1E illustrate sectional views schematically showing the manufacturing process of electronic parts using a resist of this invention.

DETAILED DESCRIPTION OF THE PREFERRED EMBODIMENT

The sulfonyl compound represented by the above general formula (1) of this invention is featured in that when it is irradiated with light, a linkage between carbon atom of the backbone chain and sulfur atom of sulfonyl group of the side chain is cut off, thus generating sulfonic acid. It is also possible in this case to cut off the backbone chain of the sulfonyl compound represented by the above general formula (1), if the energy of the light exposure is sufficiently enhanced. Therefore, by making use of the decomposition or depolymerization of the sulfonyl compound represented by the above general formula (1), it is possible even with the sole use of this sulfonyl compound to form a desired positive pattern by selectively dissolving and removing a light exposure portion of the pattern with a developing solution.

Furthermore, since the sulfonyl compound represented by the above general formula (1) is formed of a polymer structure of alkylene or arylene having on its side chains sulfonyl groups, the rigidity of the resist film to be obtained would not be substantially deteriorated in contrast to the resist containing a low molecular compound as a photo-acid generating agent. Therefore, in the formation of a pattern of very fine lines and high aspect ratio, the collapse or fracture of pattern can be effectively inhibited.

In view of inhibiting the collapse or fracture of pattern, the polymerization degree of the sulfonyl compound represented by the above general formula (1), i.e. the number of n in the above general formula (1) should preferably be 2 or more, more preferably 5 to 100. If the polymerization degree of the sulfonyl compound is less than 5, the rigidity of the resist film to be obtained would be still insufficient in rigidity. On the other hand, if the polymerization degree of the sulfonyl compound exceeds over 100, the solvent-solubility of the resist would be deteriorated, so that the preparation of varnish for forming a resist film would become difficult.

In the sulfonyl compound represented by the above general formula (1), $R^1$ should be selected from the group consisting of a hydrogen atom, a halogen atom, nitro group, cyano group and a monovalent organic group; $R^2$ should be selected from the group consisting of a halogen atom, nitro group, cyano group and a monovalent organic group. As for the monovalent organic group to be introduced into the general formula (1) as $R^1$ or $R^2$, it may be selected from the group consisting of allyl, anisyl, anthraquinolyl, acetonaphthyl, anthryl, azulenyl, benzofranyl, benzoquinoryl, benzoxazinyl, benzoxazolyl, benzyl, biphenylenyl, bornyl, butenyl, butyl, cinnamyl, cresotoil, cummenyl, cyclobutanedienyl, cyclobutenyl, cyclobutyl, cyclopentadienyl, cyclopentatrienyl, cycloheptyl, cyclohexenyl, cyclopentyl, cyclopropyl, cyclopropenyl, decyl, dimethoxyphenethyl, diphenylmethyl, dococyl, dodecyl, eicosyl, ethyl, fluolenyl, furfuryl, heptyl, hexadecyl, hexyl, hydroxymethyl, indanyl, isobutyl, isopropyl, isopropylbenzyl, isoxazolyl, menthyl, mesityl, methoxybenzyl, methoxyphenyl, methyl, methylbenzyl, naphthyl, naphthyllmethyl, nonyl, norbornyl, octacosyl, octyl, oxazinyl, oxazolidinyl, oxazolinyl, oxazolyl, pentyl, phenacyl, phenanthryl, phenathyl, phenyl, phthalidyl, propynyl, propyl, pyranyl, pyridyl, quinazonyl, quinolyl, salicyl, terephthalyl, tetrazolyl, thiazolyl, thiaphthenyl, thienyl, tolyl, trityl, trimethylsilylmethyl, trimetylsilyloxymethyl, undecyl, valeryl, veratyl and xylyl. Hydrogen atom of these organic group may be substituted by halogen atom or a group such as nitro group or cyano group. On the other hand, examples of the bivalent substituent group to be introduced as $R^3$ in the above general formula (1) are methylene, ethylene, phenylene and xylene.

However, it is particularly preferable that $R^1$ in the above general formula (1) is selected from electron attractive groups such as cyano group. If $R^1$ is selected from electron attractive groups, the efficiency of generating sulfonic acid from a sulfonyl compound represented by the above general formula (1) can be enhanced as the resist of this invention is exposed to light. The sulfonyl compound represented by the above general formula (1) can be easily synthesized by allowing a sulfonyl compound having an active methylene to be reacted with a dihalogenation compound in the presence of a basic organic compound such as diazabicycloundecene (DBU) or diazabicyclooctane (DABCO), or by allowing a dehydrogenation reaction to take place between a sulfonyl compound having an active methylene and aldehyde, thereby producing a olefin which is subsequently polymerized.

A sulfonyl compound represented by the above general formula (1) wherein $R^3$ is an imide compound represented by the general formula (2) shown below is most preferable in forming a pattern having an extremely excellent heat resistance. Therefore, the resist comprising this sulfonyl compound is useful not only for the fine working of electronic parts by means of photolithography, but also for the utilization thereof as an insulating film pattern effecting as a surface-protecting film or an interlayer insulating film of a semiconductor device.

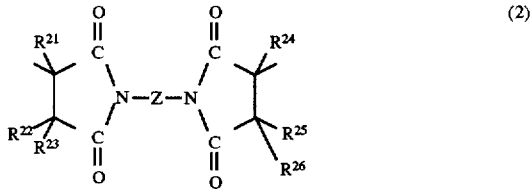

(2)

wherein $R^{21}$, $R^{22}$, $R^{23}$, $R^{24}$, $R^{25}$ and $R^{26}$ may be the same or different and are individually a hydrogen atom, a halogen atom, nitro group, cyano group or a monovalent organic group, and Z is a bivalent organic group.

This sulfonyl compound can be synthesized by allowing a sulfonyl compound having an active methylene to be reacted with a bismaleimide compound represented by the general formula (2') shown below in the presence of an organic solvent.

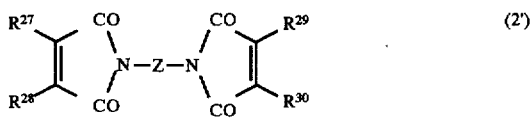

(2')

wherein $R^{27}$, $R^{28}$, $R^{29}$ and $R^{30}$ may be the same or different and are individually a hydrogen atom, a halogen atom, nitro group, cyano group or a monovalent organic group, and Z is a bivalent organic group.

This bismaleimide compound can be easily synthesized by allowing a diamino compound represented by the following formula to be reacted in an organic solvent with maleic anhydride or with a derivative thereof in the presence of trimethyl amine, cobalt acetate and acetic anhydride.

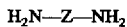

$H_2N—Z—NH_2$

As for bivalent organic group to be introduced into the general formula (2), a diamino residual group of a diamino compound can be preferably employed. In this case, examples of the diamino compound to be used in this invention are aromatic diamines such as m-phenylene diamine, p-phenylene diamine, 2,4-tolylene diamine, 4,4'-diaminodiphenyl ether, 4,4'-diaminodiphenyl methane, 4,4'-diaminodiphenyl sulfone, 4,4'-diaminodiphenyl sulfide, 2,2-bis(4-aminophenyl) propane, 2,2-bis(4-aminophenyl) hexafluoropropane, 3,4'-diaminodiphenyl ether, 3,3'-diaminodiphenyl ether, 3,3'-diaminodiphenyl ketone, 4,4'-diaminodiphenyl ketone, 4,4'-diaminobenz anilide, bis(4-aminophenyl) dimethylsilane, 1,3-bis(4-aminophenyl)-1,1,3,3-tetramethyl disiloxane, 1,3-bis(3-aminophenoxy) benzene, 1,3-bis(4-aminophenoxy) benzene, 1,4-bis(3-aminophenoxy) benzene, 4-methyl-2,4-bis(4-aminophenyl)-1-pentene, 4-methyl-2,4-bis(4-aminophenyl)-2-pentene, 1,4-bis(α, α-dimethyl-4-aminobenzyl) benzene, imino-di-p-phenylene diamine, 1,5-diamino naphthalene, 2,6-diamino naphthalene, 4-methyl-2,4-bis(4-aminophenyl) pentane, 5(or 6)-amino-1-(4-aminophenyl)-1,3,3-trimethyl indane, bis(4-aminophenyl) phosphine oxide, 4,4'-diamino azobenzene, 4,4'-diaminodiphenyl urea, 4,4'-bis(4-aminophenoxy) biphenyl, 2,2-bis[4-(4-aminophenoxy) phenyl] propane, 2,2-bis[4-(3-aminophenoxy) phenyl] propane, 4,4'-bis(4-aminophenoxy) benzophenone, 4,4'-bis(3-aminophenoxy) diphenyl sulfone, 4,4'-bis(4-aminophenoxy) diphenyl sulfone, 4,4'-bis[4-(α, α-dimethyl-4-aminobenzyl) phenoxy] benzophenone, 4,4'-bis[4-(α, α-dimethyl-4-aminobenzyl) phenoxy] diphenyl sulfone, 2,2-bis[4-(4-aminophenoxy) phenyl] hexafluoropropane, 3,5-diamino-1-hydroxybenzene, 3,3'-dihydroxy-4,4'-diaminobiphenyl, 4,4'-dihydroxy-3,3'-diaminobiphenyl, 2,2-bis(4-amino-3-hydroxyphenyl) propane, 2,2-bis(3-amino-4-hydroxyphenyl) propane, bis(3-amino-4-hydroxyphenyl) sulfide, bis(3-amino-4-hydroxyphenyl) sulfone, bis(3-amino-4-hydroxyphenyl) methane, bis(4-amino-3-hydroxyphenyl) methane, 2,2-bis(4-amino-3-hydroxyphenyl) hexafluoropropane and 2,2-bis(3-amino-4-hydroxyphenyl) hexafluoropropane. The diamino compound may be the one wherein the hydrogen atoms of the aromatic ring of these aromatic diamines are substituted by at least one substituent selected from the group consisting of chlorine atom, fluorine atom, boron atom, methyl, methoxy, cyano and phenyl.

In addition to the aforementioned aromatic diamines, other kinds of diamines such as dimethylene diamine, trimethylene diamine, tetramethylene diamine, hexamethylene diamine, heptamethylene diamine, octamethylene diamine, nonamethylene diamine, decamethylene diamine, 1,2-bis(3'-aminopropoxy) ethane, $H_2N—(CH_2)_3—O—(CH_2)_2—O—(CH_2)_3—NH_2$, 1,4-diaminocyclohexane, 4,4'-diaminodicyclohexyl methane, 1,3-bisaminomethylcyclohexane, 1,4-bisaminomethylcyclohexane, 1,3-diaminocyclohexane, 4,4'-diaminodicyclohexyl isopropane, 1,4-xylylene diamine, 2,6-diamino pyridine, 2,4-diamino-S-triazine, 1,3-bis(γ-aminopropyl)-1,1,3,3-tetramethyl disiloxane, 1,4-bis(γ-aminopropyldimethylsilyl)-benzene, 1,3-bis(4-aminobutyl)-1,1,3,3-tetramethyl disiloxane, 1,1,3,3-tetramethyl disiloxane or 1,3-bis(γ-aminopropyl)-1,1,3,3-tetraphenyl disiloxane may also be employed.

According to this invention, it is possible to form a pattern by the sole use of a sulfonyl compound represented by the general formula (1) mentioned above. However, a compound having a substituent which can be decomposed by an acid or a compound having a substituent which is capable of forming a crosslinking by the effect of an acid may be added to such a sulfonyl compound. Namely, if a compound having a substituent which can be decomposed by an acid is mixed with the sulfonyl compound, the light-exposed portion of the compound having this acid-decomposable substituent will be decomposed in the baking treatment after light exposure by sulfonic acid generating from the sulfonyl compound represented by the aforementioned general formula (1), so that the light-exposed portion can be selectively dissolved and removed by a developing solution, thus forming a positive pattern. On the other hand, if a compound having a substituent which is capable of forming a crosslinking by the effect of an acid is mixed with the sulfonyl compound to form a resist, the components of the resist at the light exposure portion will be cross-linked, thus making it insoluble to a developing solution and hence obtaining a negative pattern. These substituents that can be decomposed by an acid or that can be crosslinked by an acid may be directly introduced into the side chains of the sulfonyl compound represented by the general formula (1) as an alternative example of this invention. In view of forming a positive pattern with an alkaline development solution excellent in environmental resistance, an employment of a resist comprising a sulfonyl compound represented by the general formula (1) and a compound having a substituent group which can be decomposed by an acid thereby generating an alkali-soluble group (hereinafter referred to as an acid-decomposable compound) is particularly preferred. In this case, the acid-decomposable compound acts as a solubility-inhibiting agent so as to insolubilize the resist in an alkaline solution, and at the same time sulfonic acid is generated from the sulfonyl compound represented by the general formula (1) as the resist is exposed to light thereby decomposing the substituent moiety of the acid-decomposable compound with the sulfonic acid to generate the alkali-soluble group, thus making the resist soluble in an alkaline solution after the light exposure. Therefore, it is possible to selectively dissolve and remove the light-exposure portion of the resist with an alkaline developing solution, thus obtaining a positive pattern free from swelling and excellent in resolution.

Examples of the aforementioned substituent group which can be decomposed by an acid to generate an alkali-soluble group are esters such as t-butyl ester, isopropyl ester, ethyl ester and benzyl ester; ethers such as t-butyl ether and tetrahydropyranyl ether; alkoxy carbonates such as t-butoxy carbonate, methoxy carbonate and ethoxy carbonate; and silyl ethers such as trimethylsilyl ether, triethylsilyl ether and triphenylsilyl ether. Preferably, these substituent groups may be introduced, directly or via other substituent groups, into an alkali-soluble compound having an alkali-soluble group such as hydroxyl or carboxyl group, thereby forming an acid-decomposable compound of this invention. Examples of such an alkali-soluble compound to which the aforementioned substituent groups can be introduced are a low molecular weight aromatic compounds such as bisphenol A, bisphenol F, trihydroxydiphenyl methane, phenolphthalein, cresolphthalein, thymolphthalein, catechol, pyrogallol, naphthol and benzoic derivatives; and a low molecular weight alcohols such as cholate, steroid compounds, terpenoid and saccarides. As for the monovalent organic groups to be introduced into the aforementioned general formula (2) as $R^{21}$ to $R^{26}$, or into the aforementioned general formula (2') as $R^{27}$ to $R^{30}$, the same organic groups as exemplified in the explanation of $R^1$ and $R^2$ in the general formula (1) can be employed.

The acid-decomposable compound may be the one where the alkali-soluble groups in a polymer compound are partially or entirely substituted by substituent groups which are capable of generating an alkali-soluble group as the polymer compound is decomposed by an acid. Examples of the polymer compound having such an alkali-soluble group are a novolak resin that can be obtained by polycondensating a phenol derivative with an aldehyde derivative, the skeleton of the novolak resin containing cresol, xylynol, ethylphenol, butylphenol, phenol halide or naphthol; polyvinylphenol; polyvinylphenol whose transparency is improved by the hydrogenation of the ordinary polyvinyl phenol; polyvinylphenol derivatives whose hydroxyl group is partially protected by methyl, acetyl, butyloxycarbonyl, or pyranyl group for the purpose of controlling the alkali-solubility rate thereof; styrenated polyvinylphenol where styrene is attached thereto using a platinum catalyst; a copolymer comprising styrene, vinylphenol and sulfone; melamine-formaldehyde resin; a copolymer between 4-hydroxy maleimide, α-methylstyrene or vinylphenol and acrylic acid or a methacrylate derivative; polyimide containing hydroxyl group; and a polyimide precursor.

The acid-decomposable compound according to this invention may be formed of two kinds of the aforementioned compounds for the purpose of adjusting the resist contrast or the solubility rate thereof in an alkaline development solution. Followings are specific examples of the aforementioned acid-decomposable compounds.

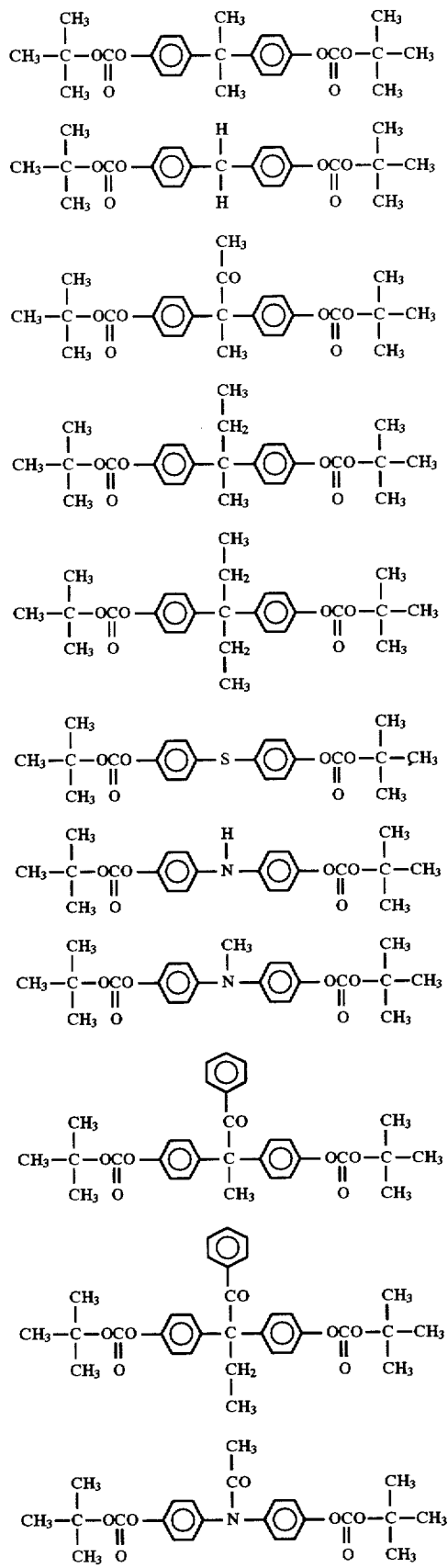

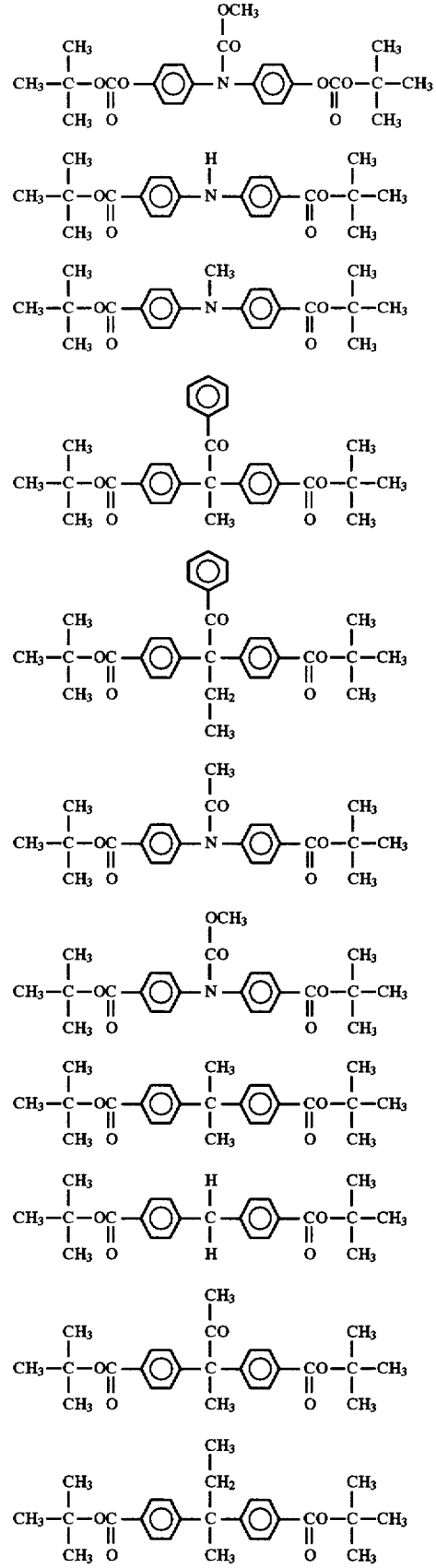
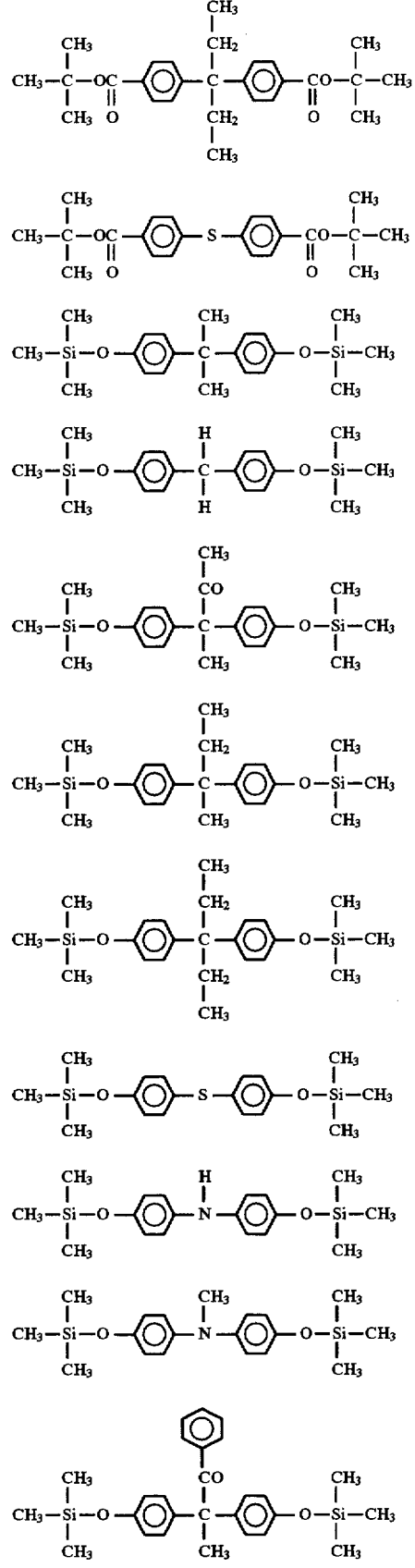

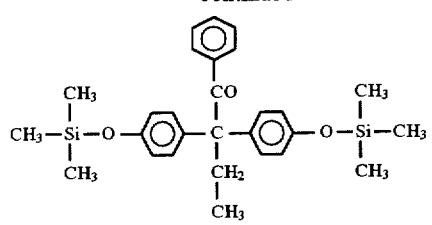
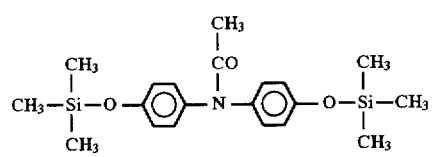
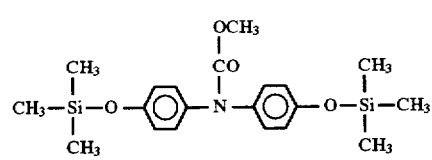
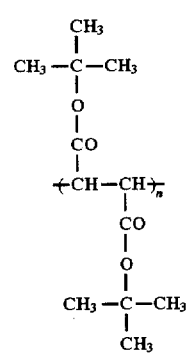
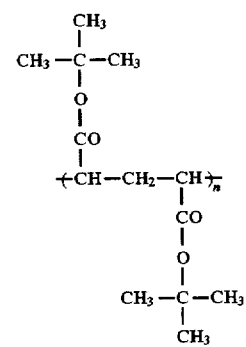
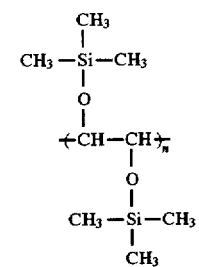
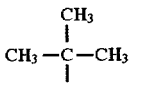
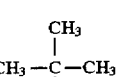
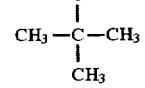
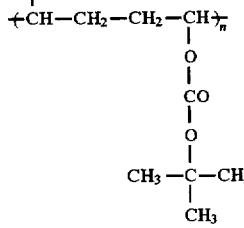
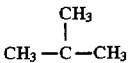
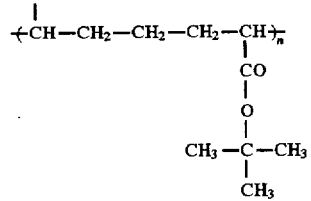
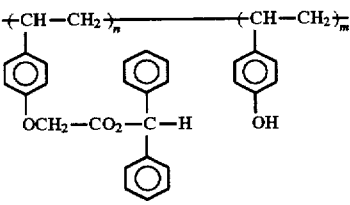
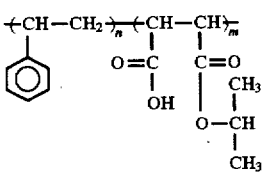

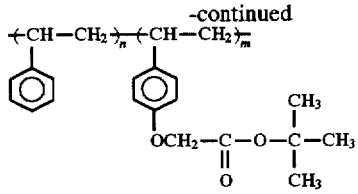

Among these acid-decomposable compounds, the compounds represented by the following general formulas (3) and (4) are preferable in particular. Namely, the compound represented by general formula (3) is preferable, since it hardly gives rise to a side reaction such as crosslinkage which may obstruct the formation of a positive pattern, thus making it possible to obtain a positive pattern extremely excellent in resolution. On the other hand, the compound represented by general formula (4) is also preferable, since the substituent group attached to the compound can be decomposed by an acid if the compound is exposed to light, and then the ring structure of the compound can be opened in an alkaline developing solution, thus generating ions of —COO⁻ and hence improving the alkali-solubility, thereby making it possible to obtain a positive pattern extremely excellent in resolution.

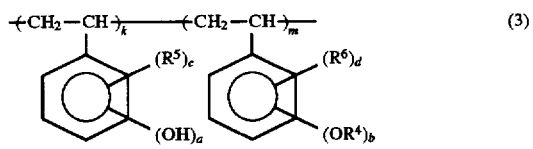

wherein $R^4$ is a group selected from the groups shown below; $R^5$ and $R^6$ may be the same or different and are individually a halogen atom or a monovalent organic group; k is 0 or an integer of 1 or more; m is an integer of 1 or more; a and b are respectively an integer of 1 or more; and c and d are each 0 or an integer of 1 or more.

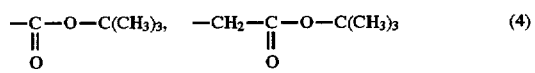

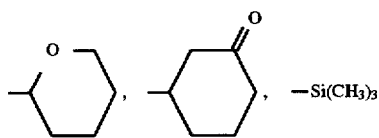

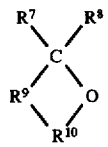

wherein $R^7$ and $R^8$ may be the same or different and are individually a hydrogen atom, a halogen atom, nitro group, cyano group, sily group or a monovalent organic group; $R^9$ is a bivalent organic group; $R^{10}$ represents >C=O or —SO₂—; $R^7$ and $R^8$ may be connected together to form a closed ring; and at least one of $R^7$ to $R^9$ contains a substituent group which can be decomposed by an acid.

The copolymerization ratio of the compound represented by the general formula (3), i.e. the value of m/(k+m) in the general formula (3) should preferably be 0.1 to 0.4. If the value of m/(k+m) is less than 0.1, the function of the compound as a solubility-inhibiting agent can not be sufficiently obtained so as to insolubilize the resist against an alkaline developing solution, thus possibly lowering the resolution of a pattern to be formed. On the other hand, if the value of m/(k+m) exceeds over 0.4, the softening point of the compound tends to be lowered. Preferable polymerization degree (k+m) of the compound represented by the general formula (3) should preferably be 100 or less. Because if the polymerization degree of the compound represented by the general formula (3) is more than 100, the solubility of the resist in a solvent would be lowered, thus making it difficult to prepare a varnish for the formation of a resist film.

As for the monovalent organic groups to be introduced into a compound represented by the aforementioned general formula (4) as $R^7$ and $R^8$, the same organic groups as exemplified in the explanation of $R^1$ and $R^2$ in the general formula (1) can be employed. On the other hand, as for the bivalent organic groups to be introduced into a compound represented by the aforementioned general formula (4) as $R^9$, a substituted or non-substituted aliphatic group such as ethylene, propylene or butylene; a group derived from a substituted or non-substituted aromatic ring such as benzene, naphthalene, anthracene, phenanthrene or piperazine; a substituted or non-substituted aliphatic ring such as cyclohexane, pyrazine, pyran or morpholane; and a group derived from a heterocyclic compound may be employed.

As for the substituent group to be introduced into at least one of $R^7$ to $R^9$ of the aforementioned general formula (4), it should preferably be a substituent which is capable of being decomposed by an acid thereby to generate an alkali-soluble group. With respect to the compound represented by the aforementioned general formula (4), the following compounds represented by the general formula (5) to (7) can be preferably employed.

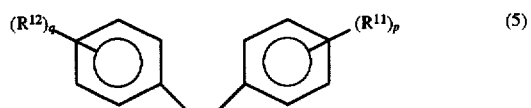

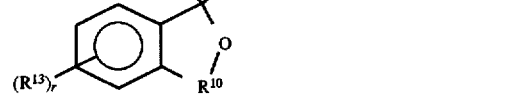

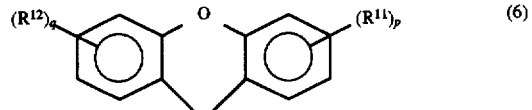

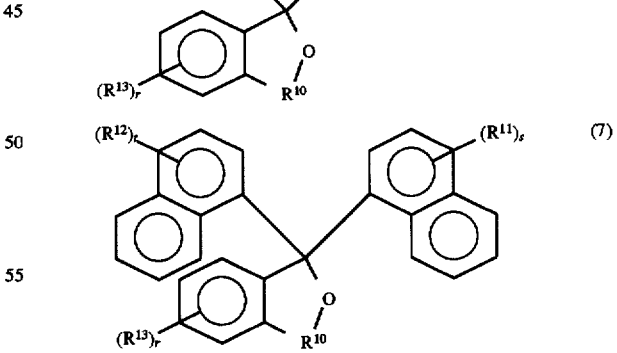

wherein $R^{10}$ represents >C=O or —SO₂—; $R^{11}$ to $R^{13}$ may be the same or different and are individually a hydrogen atom, a halogen atom, nitro group, cyano group, silyl group or a monovalent organic group; p and q are respectively an integer of 1 to 5; r is an integer of 1 to 4; s and t are each an integer of 1 to 7; a plurality of $R^{11}$, $R^{12}$ or $R^{13}$ may be different from each other; and at least one of $R^{11}$ to $R^{13}$ contains a substituent group which can be decomposed by an acid.

The compound represented by any one of the aforementioned general formulas (5) to (7) is a derivative of a compound having a hydroxyl group which is protected by a substituent to be decomposed by an acid. Examples of such a compound having such a hydroxyl group are 3-hydoxy-3-methyl phthalide, ascorbic acid, bromocresol green, bromocresol purple, bromocresol blue, bromoxylenol blue, α-chloro-α-hydroxy-o-toluene sulfonic acid-γ-sultone, chlorophenol red, cresolphthalein, eosin B, eosin Y, fluorescein, fluorescein isocyanate, phenolphthalein, phenol red, tetrabromophenol blue, 3', 3", 5', 5"-tetrabromophenolphthalein, 4,5, 6, 7-tetrachlorofluorescein, 3',3", 5', 5"-tetraiodophenolphthalein, 3',3", 5', 5"-tetraiodosulfonephthalein, thymolphthalein, naphtholphthalein and thymol blue. These compounds may be of a polymerized structure where two or more of these compounds are connected together via a bivalent or a higher valent group as shown below.

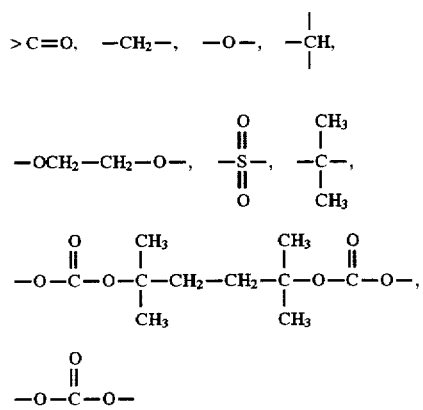

The mixing ratio of the acid-decomposable compound of this invention is preferably in the range of 0.10 to 50 parts by weight based on 1 part by weight of the sulfonyl compound represented by the general formula (1). If the mixing ratio of the acid-decomposable compound is less than 0.10 part by weight, the solubility of the non-exposure portion of resist in an alkaline developing solution can not be sufficiently inhibited. On the other hand, if the mixing ratio of the acid-decomposable compound exceeds over 50 parts by weight, the amount of the acid-decomposable compound becomes too excessive to be decomposed by sulfonic acid generated from the light exposure portion of a sulfonyl compound represented by the general formula (1), so that the resolution of the resultant pattern would be more likely to be deteriorated.

In the preparation of a resist to form a negative-type pattern comprising a sulfonyl compound represented by the general formula (1) and a compound having a substituent which is capable of forming a crosslinking by the effect of an acid, aminoplast resin may be preferably employed as the aforementioned compound having a substituent which is capable of forming a crosslinking by the effect of an acid. Specific examples the aminoplast resin are a methylolated melamine-formaldehyde resin, urea-formaldehyde resin, glycol-formaldehyde resin and benzoguanamine-formaldehyde resin.

It is also possible according to the resist of this invention to incorporate an alkali-soluble compound not having the aforementioned substituent which is capable of generating an alkali-soluble group by the effect of an acid in view of controlling the resist contrast or the dissolution rate of resist in an alkaline developing solution. In this case, the employment of a polymer having a phenol skeleton is preferable in view of improving the film-forming property of resist, and the heat resistance as well as dry etching resistance of the resist film to be formed.

Examples of the polymer having the aforementioned phenol skeleton are phenol novolak resin; cresol novolak resin; xylenol novolak resin; vinyl phenol resin; isopropenyl phenyl resin; a copolymer between vinyl phenol and acrylic acid, a methacrylic acid derivative, acrylonitrile or a styrene derivative; a copolymer between isopropenyl phenol and acrylic acid, a methacrylic acid derivative, acrylonitrile or a styrene derivative. Specific examples of these polymers are poly(p-vinyl phenol), a copolymer between p-isopropenyl phenol and acrylonitrile, a copolymer between p-isopropenyl phenol and styrene, a copolymer between p-vinyl phenol and methyl methacrylate, and a copolymer between p-vinyl phenol and styrene. Additionally, silicon-containing alkali-soluble polymer such as polysiloxane having a phenol skeleton on its side chain, polysilane having a phenol skeleton on its side chain, a novolak resin synthesized from phenol having silicon atom on its side chain may also be preferably employed in this invention. These alkali-soluble compounds may be employed as a mixture of two or more kinds.

Meanwhile, in view of enhancing the transparency of the resist film to an actinic radiation of short wavelength such as ArF excimer laser beam in addition to the dry etching resistance of the resist film, the employment of an alkali-soluble compound having an aliphatic skeleton such as a terpenoid skeleton is preferable in particular.

The mixing amount of these alkali-soluble compounds should preferably be in the range of 0.10 to 10 parts by weight based on 1 part by weight of the total of sulfonyl compound represented by the general formula (1) and the acid-decomposable compound. If the mixing ratio of the alkali-soluble compound is less than 0.10 part by weight, it would be impossible to sufficiently control the resist contrast and the dissolution rate of the resist in an alkaline developing solution. On the other hand, if the mixing ratio of the alkali-soluble compound exceeds over 10 parts by weight, the resist contrast may be rather deteriorated and at the same time the decrease of film thickness at the occasion of development would be resulted.

It is possible according to the resist of this invention to incorporate therein other kinds of polymers such as epoxy resin, polymethyl methacrylate, polymethyl acrylate, propylene oxide, ethylene oxide copolymer and polystyrene; or various additives such as an amine compound for improving the environment resistance of the resist, a basic compound such as a pyridine derivative, a surfactant for modifying a coated film and a dyestuff acting as an anti-reflection agent. As a component for the photo-acid generator, a low molecular weight compound such as an onium salt, an orthoquinone diazidosulfonic acid derivative, an organic halide, a sulfonic acid derivative and a sulfonyl compound may be employed. However, in view of preventing the deterioration of rigidity of a resist film to be obtained, the mixing ratio of these low molecular compounds as a photo-acid generator should preferably be limited to 0.50 part by weight per 1 part by weight of the sulfonyl compound represented by the general formula (1).

The sulfonyl compound represented by the general formula (1) including, if required, the acid-decomposable compound as well as the alkali-soluble compound are dissolved in an organic solvent and then filtered, thereby preparing an ordinary varnish. The examples of the organic solvent useful in this case are ketonic solvents such as cyclohexanone, acetone, methylethyl ketone and methylisobutyl ketone; Cellosolve solvents such as methyl Cellosolve, methyl Cellosolve acetate, ethyl Cellosolve acetate and butyl Cellosolve acetate; ester solvents such as ethyl acetate, butyl acetate, isoamyl acetate and γ-butyrolactone; and a mixed solvent comprising any of aforementioned solvents and an additive for enhancing the solubility such as dimethyl sulfoxide, dimethylformaldehyde and N-methyl-2-pyrrolidone. Additionally, propionic acid derivatives such as methyl methylpropionate; lactates such as ethyl lactate; and PGMEA (propyleneglycol monoethylacetate) may also be preferably employed, since they are low in toxicity. These solvents may be employed singly or in combination. These solvents may further contain toluene, xylene or an aliphatic alcohol such as isopropyl alcohol.

In the followings, the method of forming resist pattern using the resist of this invention will be explained. First of all, the varnish obtained by dissolving a resist in the aforementioned organic solvent is coated on the surface of a predetermined substrate by means of a spin coating method or a dipping method. Then, the coated layer is dried at a temperature of 150° C. or less, or preferably at a temperature of 70° to 120° C. thereby forming a resist film. The substrate to be employed in this case may be for example a silicon wafer; a silicon wafer provided thereon with various kinds of insulating films, electrodes or interconnecting wirings; a blank mask; a compound semiconductor wafer of Groups III-V elements such as GaAs and AlGaAs; a mask deposited thereon with chromium or chromium oxide; an Al-deposited substrate; an IBPSG-coating substrate; a PSG-coating substrate; an SOG-coating substrate; a carbon film-spattered substrate, etc.

Then, the resist film is irradiated through a predetermined mask pattern by an actinic radiation, or directly scanned by an actinic radiation, thereby performing the light exposure of the resist film. The light source to be employed in this exposure may be any of ultraviolet rays; X-rays; the i-, h-, or g-lines of a mercury lamp; a xenon lamp beam; a deep ultraviolet rays such as KrF or ArF excimer laser; a synchrotron orbital radiation (SOR); electron beams (EB); γ-ray; and an ion beam.

The resist film thus pattern-exposed is then subjected to a baking step generally at a temperature of not more than 150° C. by means of heating over a heated plate or oven, or by means of infra-red irradiation.

Subsequently, the resist film thus baked is subjected to a developing treatment by making use of dipping method or spraying method, thereby selectively dissolving and removing the exposed portion of the resist film to obtain a desired pattern. The alkaline solution can be preferably used in this case as the developing solution. Examples of such an alkaline solution are an organic alkali solution such as an aqueous solution of tetramethylammonium hydroxide and an aqueous solution of choline; and an inorganic alkali solution such as an aqueous solution of potassium hydroxide and sodium hydroxide. Additives such as alcohol and surfactant may be added to the developing solution. These alkaline solutions are used in general at the concentration of 15% by weight or less in view of sufficiently differentiate the dissolution rate of the light exposure portion from that of the non-exposure portion.

The resist pattern to be formed using the resist of this invention is free from the collapse and fracture of the pattern so that a very fine resist pattern can be transferred onto an exposed surface of a substrate by using this resist pattern as an etching mask and then performing an etching treatment.

For example, if a resist pattern is formed as describe above on a silicon wafer as a substrate, a very fine pattern can be obtained by treating the substrate in a reactive ion etching device of plane parallel plate type using $CF_4$ gas. On the other hand, if a transparent substrate whose surface is coated with a chromium layer is employed as a substrate and a resist pattern is formed as describe above thereon, the chromium layer can be selectively etched in high precision by using an aqueous solution of ammonium cerium nitrate as an etching solution, thereby forming a light-shielding film.

This invention will be further explained with reference to the drawing depicting one embodiment where a silicon wafer is employed as a substrate and a very fine working on electronic parts is performed by using the resist of this invention.

FIGS. 1A to 1E illustrate sectional views schematically showing the manufacturing process of electronic parts using a positive type resist for alkaline development.

First, as shown in FIG. 1A, an exposure light 14 of predetermined pattern is irradiated onto a resist film 13 formed on the surface of a silicon wafer 11. As a result of this light exposure, an acid is generated at the light exposure portions of the resist film 13.

Then, the resist film 13 is heated at a temperature of 50° to 150° C. for 0.5 to 30 minutes. As a result, an acid-decomposable compound is decomposed through catalytic reaction by the acid generated at the light exposure portion 16 as shown in FIG. 1B, thus selectively causing the light exposure portion 16 to be soluble in alkaline solution. Thereafter, this light exposure portion 16 is selectively dissolved with an alkaline developing solution, forming a desired resist pattern 17 on the resist film 13 as shown in FIG. 1C.

Then, the resist pattern 17 formed in this manner is employed as an etching mask in the etching process of the silicon wafer using $CF_4$ gas. As a result, the resist pattern 17 is transferred in high precision on the silicon wafer 11 as shown in FIG. 1D.

Finally, a resist-releasing solution such as Hakuri-10, Positive Photoresist Stripper R-10 is employed to remove the resist pattern 17 on the surface of the substrate, thereby obtaining a silicon wafer 11 having a desired pattern 18 formed thereon as shown in FIG. 1E.

Any additional steps other than explained above may be performed. For example, a step of forming a flattening layer as an underlayer for the resist film, a pretreatment step for improving the adhesion between the resist film and the underlayer, a rinsing step for removing a developing solution with water after the development of the resist film, and a step of re-irradiating ultraviolet rays before the dry etching may be conveniently performed.

This invention will be further explained with reference to Examples and Comparative Examples as follows.

EXAMPLE I 0.905 g (5 mmol) of phenylsulfonyl acetonitrile and 1.23 g (5 mmol) of α, α'-dibromo-p-xylene were dissolved in 3 mL of dimethylsulfoxide (DMSO) to form a mixed solution. Then, a solution of 1.68 g (11 mmol) of DBU in 1 g of DMSO was dripped into the mixed solution over 15 minutes. After the resultant solution is kept at room temperature for 6 hours with stirring thus allowing a reaction to take place, the reaction solution was poured into 80 mL of water to obtain a light yellowish precipitate. Then, the solvent, i.e. DMSO was removed by means of vacuum drying thereby obtaining a p-PPSA, i.e. a sulfonyl compound represented by the aforementioned general formula (1).

The same procedure as described above was repeated except that α, α'-dibromo-m-xylene or (+)-3,9- dibromocamphor was employed in place of α, α'-dibromo-p-xylene and at the same time methylsulfonyl acetonitrile or phenylsulfonyl acetophenone was employed in place of phenylsulfonyl acetonitrile, thereby synthesizing m-PPSA, p-PMSA, m-PMSA, PCMSA and p-PPSP. Further, bisphenylsulfonyl methane and α, α'-dibromo-m-xylene were employed in place of phenylsulfonyl acetonitrile and α, α'-dibromo-p-xylene respectively in the above procedure thereby synthesizing m-PBS.

Meanwhile, 0.77 g of paraformaldehyde and 4.50 g of phenylsulfonyl acetonitrile were dissolved into 30 g of dioxane to obtain a solution. To this solution was then added a small quantity of piperazine, and the resultant solution was heated at a temperature of 60° C. to obtain a reaction solution. This reaction solution was then poured into water to form a precipitate, which was subsequently dried to obtain PCPSE.

Subsequently, these p-PPSA, m-PPSA, p-PMSA, m-PMSA, PCMSA, p-PPSP, PCPSE, m-PBS and phenylsulfonyl acetonitrile (PSA), acid-decomposable compounds of DI-1, DI-2 and DI-3, and alkali-soluble compounds of ASP-1 and ASP-2 were dissolved into ethyl Cellosolve acetate according to the formulations shown in Table 1, thereby preparing various varnishes of the resists of Examples and Comparative Examples. The codes employed herein are explained as follows.

< Sulfonyl compounds represented by the general formula (1)>

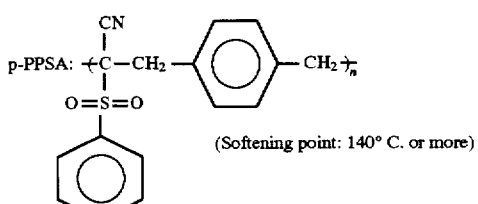

(Softening point: 140° C. or more)

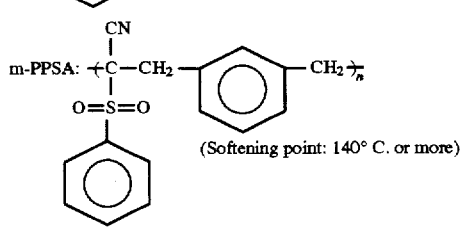

(Softening point: 140° C. or more)

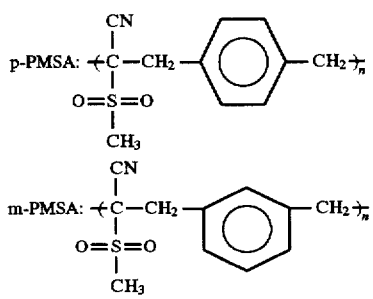

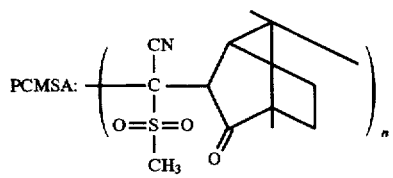

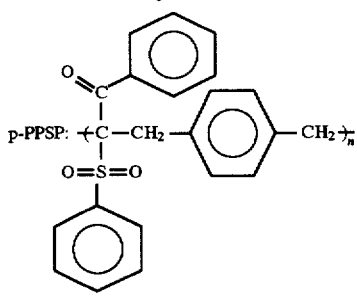

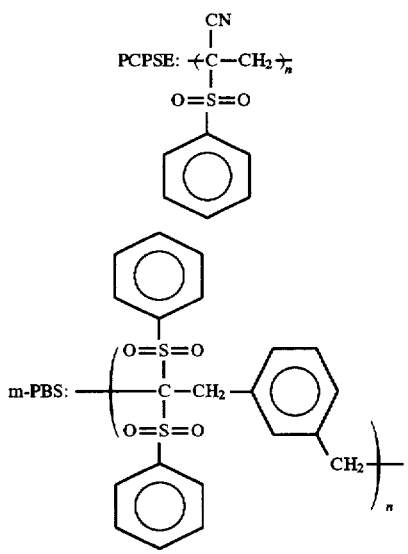
<Acid decomposable compound>
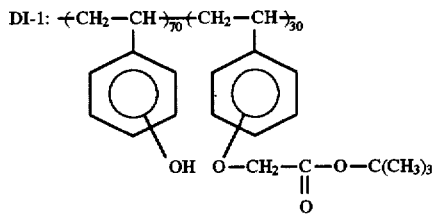
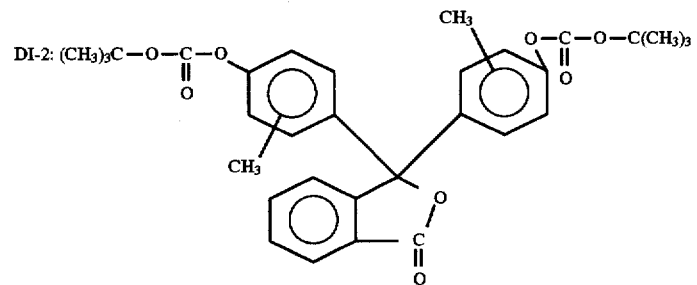
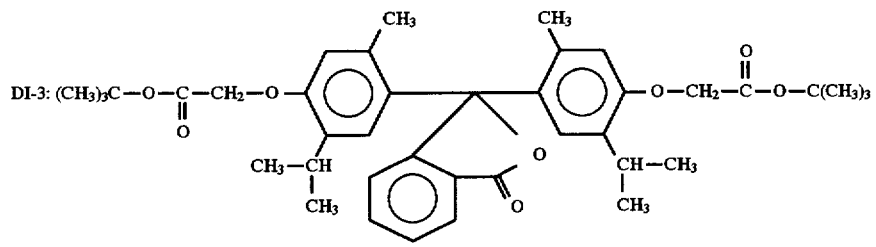
<Alkali-soluble compound>
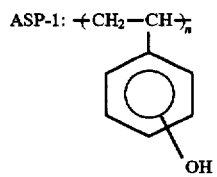

-continued

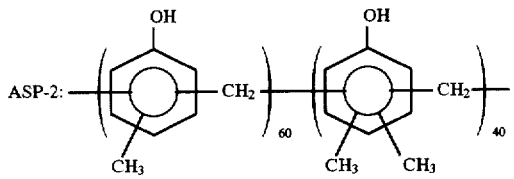

ASP-2

TABLE 1

| | Sample number | Resist Composition | | | Shape of pattern |
|---|---|---|---|---|---|
| | | Sulfonyl compound (wt. part) | Acid decomposable compound (wt. part) | Alkali-soluble compound (wt. part) | |
| Examples | I-1 | p-PPSA (10) | DI-1 (80) | ASP-1 (10) | ⊓ ⊓ |
| | I-2 | m-PPSA (10) | DI-1 (80) | ASP-1 (10) | ⊓ ⊓ |
| | I-3 | p-PMSA (10) | DI-1 (80) | ASP-1 (10) | ⊓ ⊓ |
| | I-4 | m-PMSA (10) | DI-1 (80) | ASP-1 (10) | ⊓ ⊓ |
| | I-5 | m-PPSA (10) | DI-2 (20) | ASP-2 (70) | ⊓ ⊓ |
| | I-6 | p-PPSA (10) | DI-1 (75) | ASP-1 (15) | ∩ ∩ |
| | I-7 | PCMSA (10) | DI-1 (80) | ASP-1 (10) | ⊓ ⊓ |
| | I-8 | p-PPSP (10) | DI-1 (80) | ASP-1 (10) | ⊓ ⊓ |
| | I-9 | PCPSE (10) | DI-1 (80) | ASP-1 (10) | ∩ ∩ |
| | I-10 | p-PPSA (10) | DI-3 (20) | ASP-2 (70) | ⊓ ⊓ |
| | I-11 | m-PBS (10) | DI-1 (80) | ASP-1 (10) | ⊓ ⊓ |
| | I-12 | p-PPSA (15) *TPSTF (2) | DI-1 (83) | — | ⊓ ⊓ |
| | I-13 | p-PPSA (15) | DI-1 (85) | — | ⊓ ⊓ |
| Comparative Example | I-1 | PSA (10) | DI-1 (80) | ASP-1 (10) | ⌒ ⊓ |

\* : As a photo-acid generator, p-PPSA and triphenylsulfonyltriflate (TPSTF) were co-used.

Then, each of these varnishes was spin-coated on the surface of a silicon wafer to obtain a resist film having a thickness of 1.0 µm. Subsequently, an electron beam was scanned at a dosage of 20 µC/cm² (50 keV) over the surface of the resist film obtained in this manner to irradiate a predetermined area of the resist film. Thereafter, the resist film was subjected to a baking treatment at a temperature of 80° C. for three minutes and then developed in a 2.38 wt. % aqueous solution of tetramethylammonium hydroxide thereby to selectively dissolve and remove the light-exposed portions of the resist film to obtain a positive pattern having a resolution of 0.2 µm or less.

Each of the resist patterns 0.2 µm in line width formed in this manner was observed with a scanning type electron microscope, the results being shown in Table 1. As seen from Table 1, in the sample of Comparative Example (I-1) containing PSA of low molecular weight compound as a photo-acid generating agent in the resist, the collapsing of pattern was found therein. However, such a collapsing or fracture of pattern was not recognized in the sample of Examples (I-1) to (I-13), thus indicating that a pattern of very fine lines and high aspect ratio could be formed according to Examples (I-1) to (I-13).

EXAMPLE II 9.05 g (50 mmol) of phenylsulfonyl acetonitrile and 17.9 g (5 mmol) of bis(4-N-maleimidephenyl) methane were mixed 100 g of acetic acid, and the resultant mixture was allowed to react for 24 hours at a reaction temperature of 80° C. with stirring thereby to synthesize a polymer. Then, the reaction mixture was poured into 1,000 mL of water to obtain a light yellowish precipitate. Then, the solvent, i.e. acetic acid was removed by drying the precipitate at a temperature of 60° C. under a reduced pressure, thereby obtaining a sulfonyl compound (SBM-1).

The same procedure as described above was repeated except that bis(4-N-maleimidephenyl) methane was replaced by bis(4-N-maleimidephenyl) sulfone, 1,3-phenylenebis-N-maleimide, 2,2-bis(4-hydroxy-3-N-maleimidephenyl) hexafluoropropane, or 2,2-bis[4-(4-N-maleimidophenoxy) phenyl] propane, thereby synthesizing SBM-2, SBM-3, SBM-4 and SBM-5. These sulfonyl compounds as well as the codes thereof are explained as follows.

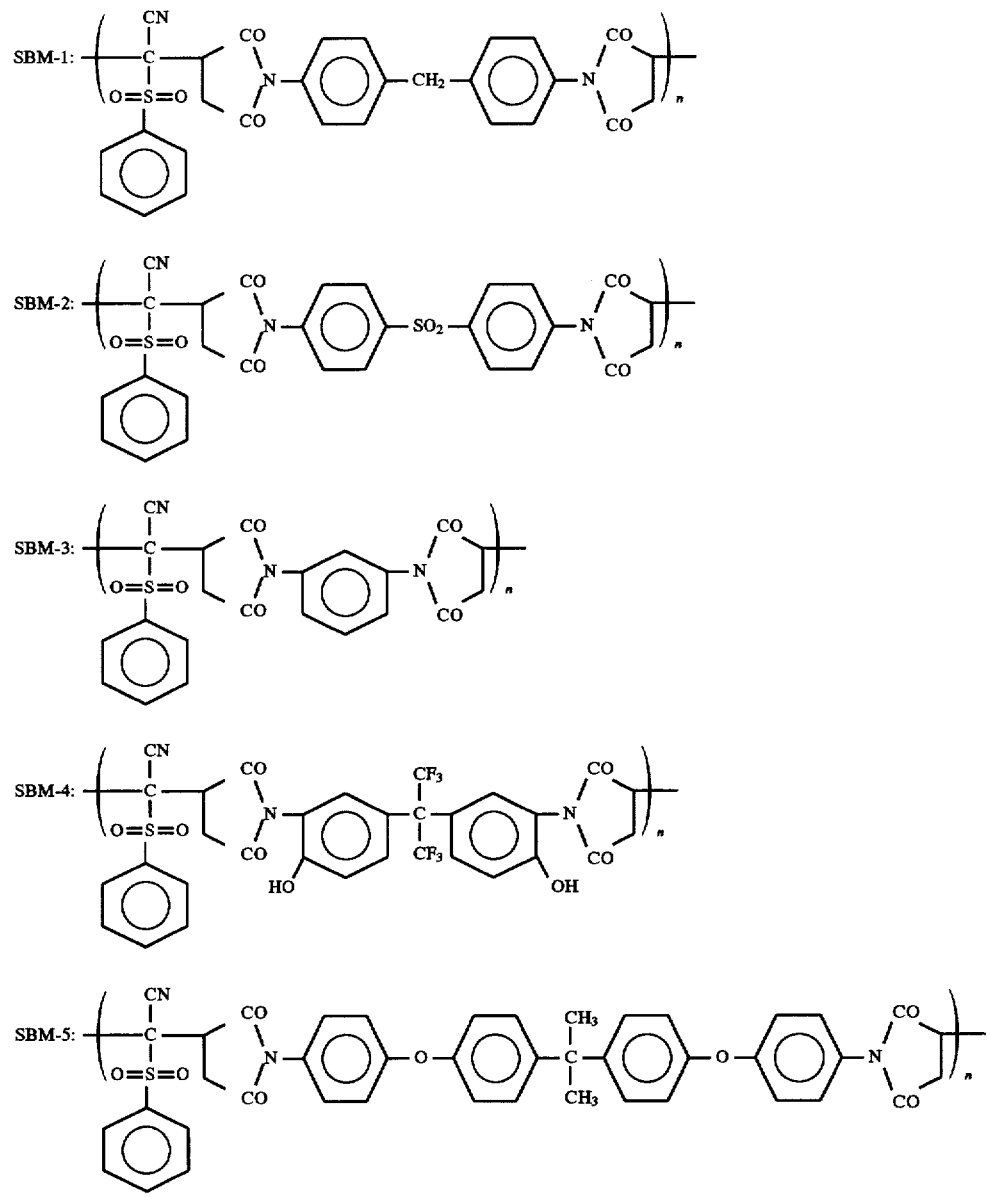

Subsequently, these SBM-1, SBM-2, SBM-3, SBM-4, SBM-5 and phenylsulfonyl acetonitrile (PSA) as well as the same kinds of acid-decomposable compounds and alkali-soluble compounds as employed in Example I were dissolved into a solvent according to the formulations shown in Table 2, thereby preparing various varnishes of the resists of Examples and Comparative Examples. The solvent employed in these samples was a mixed solvent comprising ethyl Cellosolve acetate and N-methyl-2-pyrrolidone (volume ratio=1:1).

In this Example II, the following compound DI-4 was employed as an acid-decomposable compound, and PI-1 and PI-2 were employed as an alkali-soluble compound.

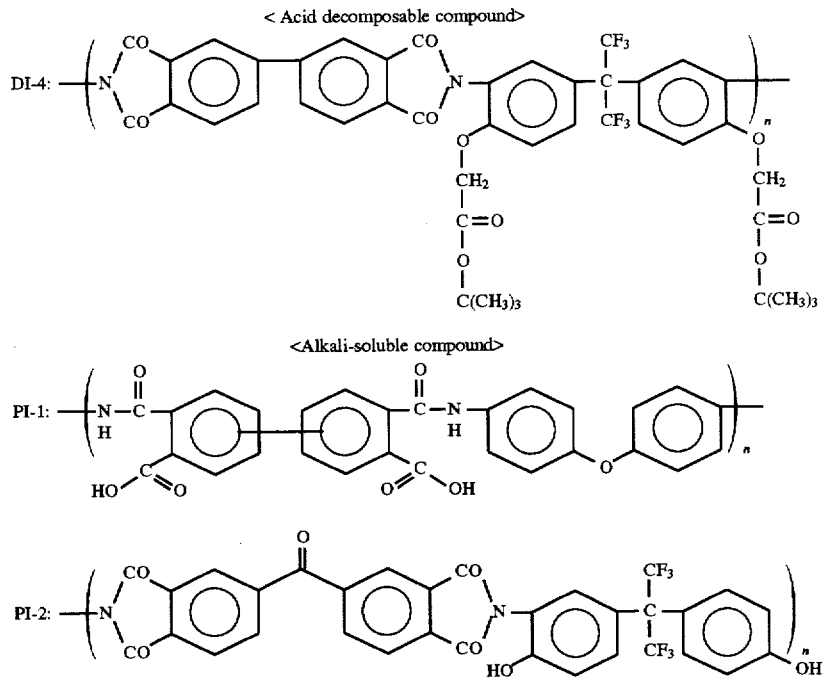

TABLE 2

|  | Sample number | Resist Composition | | | Shape of pattern |
|---|---|---|---|---|---|
|  |  | Sulfonyl compound (wt. part) | Acid decomposable compound (wt. part) | Alkali-soluble compound (wt. part) |  |
| Examples | II-1 | SBM-1 (60) | DI-1 (30) | ASP-1 (10) | ⊓ ⊓ |
|  | II-2 | SBM-1 (50) | DI-2 (40) | ASP-2 (10) | ⊓ ⊓ |
|  | II-3 | SBM-2 (50) | DI-1 (40) | ASP-1 (10) | ⊓ ⊓ |
|  | II-4 | SBM-3 (30) | DI-1 (60) | ASP-1 (10) | ⊓ ⊓ |
|  | II-5 | SBM-4 (60) | DI-1 (30) | ASP-1 (10) | ⊓ ⊓ |
|  | II-6 | SBM-4 (15) | DI-4 (75) | ASP-1 (10) | ⊓ ⊓ |
|  | II-7 | SBM-5 (30) | DI-2 (60) | ASP-2 (10) | ⊓ ⊓ |
|  | II-8 | SBM-5 (80) | DI-1 (10) | ASP-2 (10) | ∩ ∩ |

TABLE 2-continued

| | Sample number | Sulfonyl compound (wt. part) | Acid decomposable compound (wt. part) | Alkali-soluble compound (wt. part) | Shape of pattern |
|---|---|---|---|---|---|
| | II-9 | SBM-1 (60) | DI-1 (30) | PI-1 (10) | |
| | II-10 | SBM-1 (60) | DI-1 (30) | PI-2 (10) | |
| Comparative Example | II-1 | PSA (10) | DI-1 (80) | ASP-1 (10) | |

Then, each of these varnishes of resist was spin-coated on the surface of a silicon wafer and then heated at a temperature of 100° C. for 20 minutes to obtain a resist film having a thickness of 1.0 μm. Subsequently, an electron beam was scanned at a dosage of 20 μ/cm² (50 keV) over the surface of the resist film obtained in this manner to irradiate a pre-determined area of the resist film. Thereafter, the resist film was subjected to a baking treatment at a temperature of 80° C. for five minutes and then developed in a 2.38 wt. % aqueous solution of tetramethylammonium hydroxide thereby to selectively dissolve and remove the light-exposed portions of the resist film to obtain a positive pattern having a resolution of 0.2 μm or less.

Each of the resist patterns 0.2 μm in line width formed in this manner was observed with a scanning type electron microscope, the results being shown in Table 2. As seen from Table 2, in the sample of Comparative Example (II-1) containing PSA of low molecular weight compound as a photo-acid generating agent in the resist, the collapsing of pattern was found therein. However, such a collapsing or fracture of pattern was not recognized at all in the sample of Examples (II-1) to (II-10), thus indicating that a pattern of very fine lines and high aspect ratio could be formed according to Examples (II-1) to (II-10).

Moreover, although the sulfonyl compounds employed in this Example II were polyimide compounds of the aforementioned general formula (1) where $R^3$ is formed of an imide structure, there is substantially no limitation regarding the imide structure of this $R^3$ in the achievement of a sufficient adhesion between the resist pattern and the substrate.

As explained above, it is possible with the resist of this invention to form a resist film having a sufficient rigidity and at the same time to obtain, in a high sensitivity, a resist pattern of very fine lines and high aspect ration while making it possible to inhibit any collapse and fracture of pattern, thus providing a great value in industrial viewpoint.

What is claimed is:

1. A resist comprising:

a compound having a substituent that is capable of generating an alkali-soluble group as it is decomposed by an acid; and a sulfonyl compound represented by the following general formula (1):

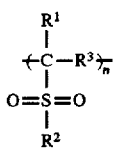

(1)

wherein $R^1$ is a hydrogen atom, a halogen atom, nitro group, cyano group or a monovalent organic group, $R^2$ is a halogen atom, nitro group, cyano group or a monovalent organic group, $R^3$ is a bivalent organic group, and n is an integer of 2 or more.

2. The resist according to claim 1, wherein said compound having a substituent which is capable of generating an alkali-soluble group is mixed in the range of from 0.10 part by weight to 50 parts by weight per 1 part by weight of the compound represented by the general formula (1).

3. The resist according to claim 1, wherein said compound having a substituent which is capable of generating an alkali-soluble group is either one of the compounds represented by the following general formulas (3) and (4):

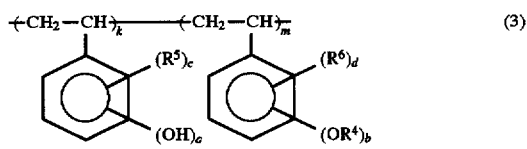

(3)

wherein $R^4$ is a group selected from the groups shown below; $R^5$ and $R^6$ may be the same or different and are individually a halogen atom or a monovalent organic group; k is 0 or an integer of 1 or more; m is an integer of 1 or more; a and b are respectively an integer of 1 or more; and c and d are each 0 or an integer of 1 or more

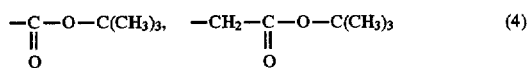

(4)

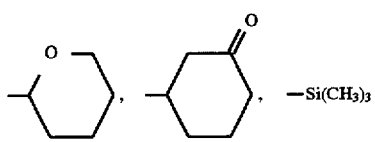

31

-continued

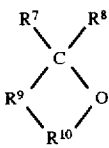

wherein R⁷ and R⁸ may be the same or different and are individually a hydrogen atom, a halogen atom, nitro group, cyano group, silyl group or a monovalent organic group; R⁹ is a bivalent organic group; R¹⁰ represents >C=O or —SO₂—; R⁷ and R⁸ may be connected together to form a closed ring; and at least one of R⁷ to R⁹ contains a substituent group which can be decomposed by an acid.

4. The resist according to claim 1, which further comprise an alkali-soluble compound.

5. The resist according to claim 4, wherein a mixing ratio of said alkali-soluble compound is 0.10 part by weight to 10 parts by weight per 1 part by weight of a total of the sulfonyl compound represented by the general formula (1) and said compound having a substituent which is capable of generating an alkali-soluble group.

6. The resist according to claim 1, wherein R¹ is an electron attractive group.

7. The resist according to claim 1, wherein said R³ in the general formula (1) is a bivalent organic group represented by the following general formula (2):

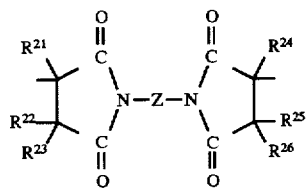 (2)

wherein R²¹, R²², R²³, R²⁴, R²⁵ and R²⁶ may be the same or different and are individually a hydrogen atom, a halogen atom, nitro group, cyano group or a monovalent organic group, and Z is a bivalent organic group.

8. The resist according to claim 7, which further comprises a compound having a substituent which is capable of generating an alkali-soluble group as it is decomposed by an acid.

9. The resist according to claim 8, wherein said compound having a substituent which is capable of generating an alkali-soluble group is either one of the compounds represented by the following general formulas (3) and (4):

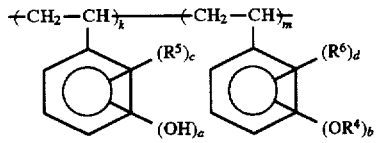 (3)

wherein R⁴ is a group selected from the groups shown below; R⁵ and R⁶ may be the same or different and are individually a halogen atom or a monovalent organic group; k is 0 or an integer of 1 or more; m is an integer of 1 or more; a and b are respectively an integer of 1 or more; and c and d are each 0 or an integer of 1 or more;

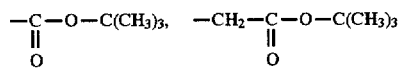 (4)

32

-continued

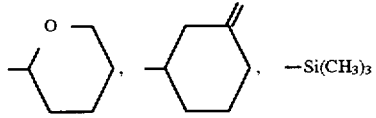

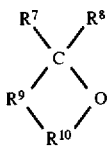

wherein R⁷ and R⁸ may be the same or different and are individually a hydrogen atom, a halogen atom, nitro group, cyano group, silyl group or a monovalent organic group; R⁹ is a bivalent organic group; R¹⁰ represents >C=O or —SO₂—; R⁷ and R⁸ may be connected together to form a closed ring; and at least one of R⁷ to R⁹ contains a substituent group which can be decomposed by an acid.

10. The resist according to claim 8, which further comprise an alkali-soluble compound.

11. A method of forming a resist pattern, which comprises the steps of:

coating a resist comprising a compound having a substituent that is capable of generating an alkali-soluble group as it is decomposed by an acid, and a sulfonyl compound represented by the following general formula (1) on a substrate thereby forming a resist film;

exposing said resist film to a light pattern; and developing said resist film by using a developing solution:

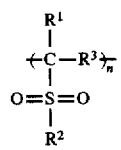 (1)

wherein R¹ is a hydrogen atom, a halogen atom, nitro group, cyano group or a monovalent organic group, R² is a halogen atom, nitro group, cyano group or a monovalent organic group, R³ is a bivalent organic group, and n is an integer of 2 or more.

12. The method of forming a resist pattern according to claim 11, wherein said resist further comprises a compound having a substituent which is capable of generating an alkali-soluble group as it is decomposed by an acid.

13. The method of forming a resist pattern according to claim 12, wherein said compound having a substituent which is capable of generating an alkali-soluble group is either one of the compounds represented by the following general formulas (3) and (4):

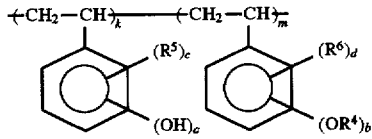 (3)

wherein R⁴ is a group selected from the groups shown below; R⁵ and R⁶ may be the same or different and are individually a halogen atom or a monovalent organic group; k is 0 or an integer of 1 or more; m is an integer of 1 or more; a and b are respectively an integer of 1 or more; and c and d are each 0 or an integer of 1 or more;

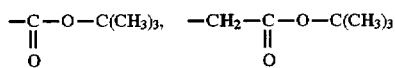 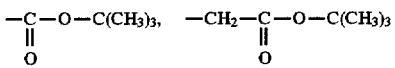

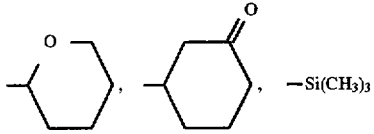 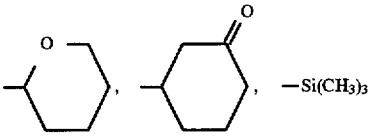

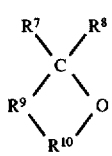 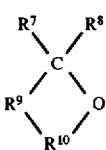

wherein $R^7$ and $R^8$ may be the same or different and are individually a hydrogen atom, a halogen atom, nitro group, cyano group, silyl group or a monovalent organic group; $R^9$ is a bivalent organic group; $R^{10}$ represents >C=O or —SO$_2$—; $R^7$ and $R^8$ may be connected together to form a closed ring; and at least one of $R^7$ to $R^9$ contains a substituent group which can be decomposed by an acid.

14. The method of forming a resist pattern according to claim 12, wherein said resist further comprises an alkali-soluble compound.

15. The method of forming a resist pattern according to claim 11, wherein said $R^3$ in the general formula (1) is a bivalent organic group represented by the following general formula (2):

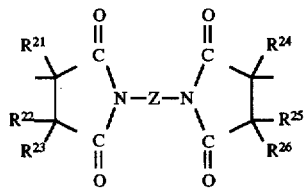

wherein $R^{21}$, $R^{22}$, $R^{23}$, $R^{24}$, $R^{25}$ and $R^{26}$ may be the same or different and are individually a hydrogen atom, a halogen atom, nitro group, cyano group or a monovalent organic group, and Z is a bivalent organic group.

16. The method of forming a resist pattern according to claim 15, wherein said resist further comprises a compound having a substituent which is capable of generating an alkali-soluble group as it is decomposed by an acid.

17. The method of forming a resist pattern according to claim 16, wherein said compound having a substituent which is capable of generating an alkali-soluble group is either one of the compounds represented by the following general formulas (3) and (4):

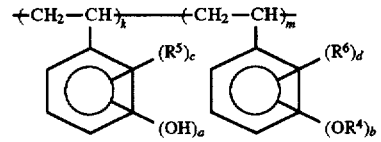

wherein $R^4$ is a group selected from the groups shown below; $R^5$ and $R^6$ may be the same or different and are individually a halogen atom or a monovalent organic group; k is 0 or an integer of 1 or more; m is an integer of 1 or more; a and b are respectively an integer of 1 or more; and c and d are each 0 or an integer of 1 or more;

wherein $R^7$ and $R^8$ may be the same or different and are individually a hydrogen atom, a halogen atom, nitro group, cyano group, silyl group or a monovalent organic group; $R^9$ is a bivalent organic group; $R^{10}$ represents >C=O or —SO$_2$—; $R^7$ and $R^8$ may be connected together to form a closed ring; and at least one of $R^7$ to $R^9$ contains a substituent group which can be decomposed by an acid.

18. The method of forming a resist pattern according to claim 16 wherein said resist further comprises an alkali-soluble compound.

19. A method of manufacturing electronic parts, which comprises the steps of:

coating a resist comprising a compound having a substituent that is capable of generating an alkali-soluble group as it is decomposed by an acid, and a sulfonyl compound represented by the following general formula (1) on a substrate thereby forming a resist film;

exposing said resist film to a light pattern;

developing said resist film by using a developing solution thereby forming a resist pattern; and performing a patterning of the substrate by making use of the resist pattern an etching mask;

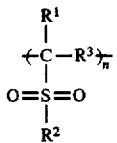

wherein $R^1$ is a hydrogen atom, a halogen atom, nitro group, cyano group or a monovalent organic group, $R^2$ is a halogen atom, nitro group, cyano group or a monovalent organic group, $R^3$ is a bivalent organic group, and n is an integer of 2 or more.

20. The method of manufacturing electronic parts according to claim 19, wherein said resist further comprises a compound having a substituent which is capable of generating an alkali-soluble group as it is decomposed by an acid.

21. The method of manufacturing electronic parts according to claim 20, wherein said compound having a substituent which is capable of generating an alkali-soluble group is either one of the compounds represented by the following general formulas (3) and (4):

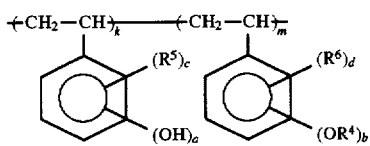
(3)

wherein $R^4$ is a group selected from the groups shown below; $R^5$ and $R^6$ may be the same or different and are individually a halogen atom or a monovalent organic group; k is 0 or an integer of 1 or more; m is an integer of 1 or more; a and b are respectively an integer of 1 or more; and c and d are each 0 or an integer of 1 or more;

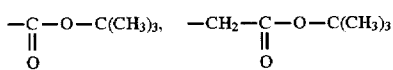
(4)

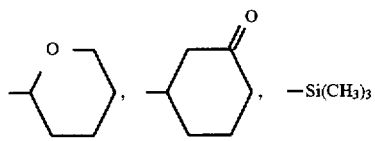

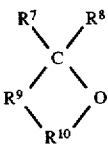

-continued wherein $R^7$ and $R^8$ may be the same or different and are individually a hydrogen atom, a halogen atom, nitro group, cyano group, silyl group or a monovalent organic group; $R^9$ is a bivalent organic group; $R^{10}$ represents >C=O or —SO$_2$—; $R^7$ and $R^8$ may be connected together to form a closed ring; and at least one of $R^7$ to $R^9$ contains a substituent group which can be decomposed by an acid.

22. The method of manufacturing electronic parts according to claim 20, wherein said resist further comprises an alkali-soluble compound.

* * * * *